United States Patent [19]

Goehausen

[11] Patent Number: 5,456,760
[45] Date of Patent: Oct. 10, 1995

[54] CLEANING PROCESS FOR ELECTRONIC AND ELECTRICAL ASSEMBLIES

[75] Inventor: Hans J. Goehausen, Langenfeld, Germany

[73] Assignee: Henkel Kommanditgesellschaft auf Aktien, Duesseldorf, Germany

[21] Appl. No.: 182,012

[22] PCT Filed: Jul. 13, 1992

[86] PCT No.: PCT/EP92/01588

§ 371 Date: Jan. 24, 1994

§ 102(e) Date: Jan. 24, 1994

[87] PCT Pub. No.: WO/9302173

PCT Pub. Date: Feb. 4, 1993

[30] Foreign Application Priority Data

Jul. 22, 1991 [DE] Germany ............... 41 24 246.7

[51] Int. Cl.⁶ .................. C23G 5/02; B08B 3/08
[52] U.S. Cl. .............. 134/42; 134/38; 252/170; 252/171
[58] Field of Search ................ 134/38, 40, 42; 252/170, 171, 542

[56] References Cited

U.S. PATENT DOCUMENTS

| 4,276,186 | 6/1981 | Bakos et al. ............... 252/170 X |
| 4,968,447 | 11/1990 | Dixon et al. ............... 252/174.23 |
| 4,983,224 | 1/1991 | Mombrun et al. ............... 134/40 |
| 5,116,426 | 5/1992 | Asano et al. ............... 134/40 |
| 5,128,057 | 7/1992 | Bixenman ............... 252/162 |
| 5,183,514 | 2/1993 | Marquis et al. ............... 134/38 |
| 5,238,504 | 8/1993 | Henry ............... 134/40 |
| 5,271,775 | 12/1993 | Asano et al. ............... 134/40 |
| 5,302,313 | 4/1994 | Asano et al. ............... 252/171 |

FOREIGN PATENT DOCUMENTS

| 0120319 | 10/1984 | European Pat. Off. . |
| 0416763 | 3/1991 | European Pat. Off. . |
| 0419089 | 3/1991 | European Pat. Off. . |
| 2531805 | 2/1984 | France . |
| 2033421 | 5/1980 | United Kingdom . |

OTHER PUBLICATIONS

Chemical Abstracts, vol. 114 (1991), p. 139 Abs. 114:84372 g.

Primary Examiner—David A. Simmons
Assistant Examiner—Saeed Chandhry
Attorney, Agent, or Firm—Ernest G. Szoke; Norvell E. Wisdom, Jr.; Real J. Grandmaison

[57] ABSTRACT

The invention relates to the use of diacetone alcohol in water-miscible cleaning agents free from halogenated hydrocarbons for cleaning electronic and electrical assemblies. Diacetone alcohol can be used to particularly good effect in the removal of fluxes because, in addition to rosin residues, the so-called "white residues" are also removed.

19 Claims, No Drawings

CLEANING PROCESS FOR ELECTRONIC AND ELECTRICAL ASSEMBLIES

FIELD OF THE INVENTION

STATEMENT OF RELATED ART

This invention relates to water-miscible cleaning agents free from halogenated hydrocarbons for cleaning electronic and electrical assemblies and to the use of the cleaning agent for the removal of flux from circuit boards after soldering.

Basically, fluxes based on rosin are made up of products belonging to two different chemical groups, namely relatively apolar resin-like compounds, for example rosin, and polar compounds, so-called activators. In accordance with the laws of chemistry, the chemical compounds dissolve best in solvents of the same type, i.e. in apolar or polar cleaning agents. Particular problems arise in the prior art when the carboxylic acids used as activators are present in the rosin in concentrations of up to 35% and, in some cases, are insoluble in fluorinated hydrocarbons or chlorinated hydrocarbons and only sparingly soluble in alcohols. This often leads to dissolution of the rosin and to exposure of white residues of the activators which, freed from the insulating effect of the rosin, can become conductive and corrosive under the effect of atmospheric moisture.

Until very recently, fluorinated hydrocarbons were mainly used for cleaning electronic and electrical assemblies, more particularly for removing rosin-containing fluxes from circuit boards after soldering. In view of the problem of destruction of the ozone layer by chlorofluorocarbons, attempts have recently been made to develop alternative cleaning agents.

DE-A 23 16 720 describes a cleaning agent for removing rosin-containing residues from electrical equipment which is said largely to eliminate rosin residues and activators, if any, but which on the other hand does not affect the insulating materials and metals normally used in electrical circuits. The cleaning solution contains in particular a polar, higher alcohol, more particularly butyl glycol or n-butanol, a polar lower alcohol, more particularly methanol or isopropanol, in addition to an apolar hydrocarbon, more particularly trichlorotrifluoroethane or hexane, optionally in the presence of a nonionic wetting agent. Firstly, a water-immiscible cleaning agent is obtained through the use of the polar hydrocarbon. Secondly, the chlorofluorocarbon used should be avoided on account of its ozone-destroying effect. In addition, cleaning agents of the type in question have extremely low flash points without the chlorofluorocarbons so that their practical application requires appropriate explosion-proof equipment.

A cleaning agent containing non-halogenated hydrocarbons, a fluorinated alcohol and, optionally, other polar organic solvents in addition to halogenated hydrocarbons is known from EP-A-0 120 319. In view of the presence of halogenated hydrocarbons, this cleaning agent does not satisfy present-day requirements.

EP-A-0 416 763 describes the cleaning of electronic circuit boards with preparations containing terpenes or other non-halogenated solvents. Unfortunately, these cleaning agents have an extremely low flash point so that appropriate anti-explosion measures have to be taken for their practical application.

EP-A-0 419 089 describes a cleaning agent containing dimethyl cyclooctadiene.

The use of diacetone alcohol for dissolving rosin and many natural and synthetic resins is known from *Römpps Chemie-Lexikon* [Title in English: Römpps Chemical Dictionary], 9th Edition, Vol. 2 (1990), page 923, keyword "diacetone alcohol".

Water-tree solvent mixtures consisting of chlorofluorocarbons and ketones are known from *Chemical Abstracts*, Vol. 114 (1991), page 139, Abstract 114:84372 g from JP-A90/202998. In addition to the chlorofluorocarbons mentioned, diacetone alcohol inter alia is used for removing fluxes.

DESCRIPTION OF THE INVENTION

Object of the Invention

By contrast, the problem addressed by the present invention was to provide a water-miscible preparation free from halogenareal hydrocarbons for cleaning electronic and electrical assemblies which would be capable of safely removing the polar and apolar substances present in the fluxes, particularly those based on rosin, without the use of chlorofluorocarbons or chlorinated hydrocarbons. In addition, the preparation would have a flash point above 60° C. which could be further increased by addition of water, depending on the particular application. A further requirement to be satisfied was universal useability in immersion/flood systems, ultrasonic baths and spray systems.

The cleaning agent according to the invention would also have to be completely removable by rinsing with water after cleaning.

SUMMARY OF THE INVENTION

It has now been found that water-miscible cleaning agents free from halogenated hydrocarbons based on diacetone alcohol are capable of satisfying all the requirements mentioned above. In a first embodiment, therefore, the present invention relates to water-miscible preparations free from halogenated hydrocarbons and containing diacetone alcohol for cleaning electronic and electrical assemblies. According to the invention, the cleaning agents contain 30 to 90% by weight of diacetone alcohol, based on the cleaning agent. It has also been found that, in addition to the good dissolving effect of diacetone alcohol on rosin known per se, the so-called "white residues" emanating from the activators could also be removed substantially completely with diacetone alcohol.

DESCRIPTION OF PREFERRED EMBODIMENTS

It has also been found that diacetone alcohol need not necessarily be used in an anhydrous medium for the purposes of the invention. Instead, the diacetone alcohol may also be used in the form of an aqueous solution. Aqueous solutions preferably contain at least 30% by weight of diacetone alcohol, based on the cleaning agent. A diacetone alcohol content, based on the cleaning agent, of 30 to 80% by weight is particularly preferred, a content of 50 to 70% by weight being most particularly preferred.

In addition, cleaning agents according to the invention may contain other additives. For example, surfactants may be added to reduce the surface tension. Surfactants suitable for this purpose are, for example, known nonionic and anionic surfactants. Examples of suitable nonionic surfactants are adducts of ethylene oxide and/or propylene oxide with fatty alcohols, fatty amines, fatty acids or alkyl phenols. Examples of suitable anionic surfactants are alkyl benzenesulfonates, alkanesulfates, alkanesulfonates, fatty alkyl ether sulfates or α-sulfofatty acid esters. The cleaning agent may contain up to 10% by weight and, more particularly, from 1 to 5% by weight of these surfactants used for the stated purpose.

Corrosion inhibitors for inhibiting corrosion on the metallic surface of the article to be cleaned are known in the prior art and, as such, may also be used for the purposes of the present invention. For example, copper corrosion inhibitors, such as benzotriazole and/or tolyl triazole, may be used. A suitable concentration range for these corrosion inhibitor additives is from 0.01 to 5% by weight and, more particularly, from 0.01 to 1% by weight.

In another embodiment, preferred cleaning agents according to the invention contain water-soluble organic nitrogen bases, more particularly triethanolamine, for the accelerated separation of acidic constituents from the flux resin and, more particularly, the activators used. The nitrogen bases are preferably used in a quantity of 1 to 10% by weight and, more preferably, in a quantity of 2 to 5% by weight, based on the cleaning agent.

The cleaning agents according to the invention may also contain water-soluble organic solvents containing one or more polar groups, more particularly those containing an alcohol group and having a boiling point below 300° C., i.e. linear alcohols, such as butanol, hexyl alcohol, decanol, etc. and branched isomers thereof, those containing an alicyclic alcohol group, for example embodied in cyclohexanol, those containing several alcohol groups, more particularly glycols, for example embodied in hexylene glycol, those containing an ether group, glycol ethers, for example embodied in ethylene glycol monobutyl ether, ethylene glycol dibutyl ether, etc., and those containing an ester group, such as glycolic acid ester or glycol ester, for example ethyl glycol acetate. In addition, lactones or lactams, more particularly N-methyl-2-pyrrolidone, may be present in the cleaning agents according to the invention. A key criterion in the choice of these so-called cleaning boosters is the flash point of the cleaning agent obtained which should not be lowered to values below 60° C. through the addition of these cleaning boosters. These water-soluble solvent cleaning boosters are preferably present in the cleaning agents according to the invention in a quantity of up to 30% by weight and, more preferably, in a quantity of 5 to 20% by weight, based on the cleaning agent.

In another embodiment of the present invention, the cleaning agents may contain up to 5% by weight and, more particularly, 1 to 2% by weight alkali metal phosphates, based on the cleaning agents, as builders. In the context of the invention, alkali metal phosphates are understood to be alkali metal orthophosphates, pyrophosphates and triphosphates (also referred to as "tripolyphosphates"). Of these, however, the triphosphates are preferred for the purposes of the invention, potassium triphosphate or sodium triphosphate being particularly preferred.

The percentages by weight mentioned above for the individual components should always be understood to add to 100% by weight.

In the cleaning of printed circuit boards using the cleaning agent according to the invention, the circuit boards are immersed in the cleaning agent which is kept at a temperature between room temperature and about 100° C. and, more particularly, at a temperature of 30° to 70° C. If desired, immersion may be accompanied by ultrasonication, stirring, vibration, blowing through of air, liquid circulation. Alternatively, cleaning may be carried out by spraying, immersion, brushing, flooding and combinations thereof.

After cleaning as described above, the circuit boards may either be removed (from the cleaning bath) and simply dried or, alternatively, may be cleaned once more with the same cleaner (bath) or with conventional halogen-containing solvents, such as chlorofluorocarbons or chlorine-containing cleaners or cleaners of the alcohol type. The quantities of halogen-containing cleaners used for this purpose are distinctly smaller than the quantities in which the halogen-containing cleaners are used in the first cleaning step.

After cleaning, the circuit boards are preferably rinsed with water. It is of particular advantage to use water when either a considerable quantity of water-soluble substances remains behind on the circuit boards or when fine dust-like residues are present thereon in relatively large quantities. The water used for rinsing is not contaminated with halogenated hydrocarbons, as is the case with corresponding cleaning agents of the prior art, but instead contains only biodegradable substances.

In addition, the printed circuit boards may be dried after the treatment described above, for example at elevated temperature in a drying cabinet or in a suitable dryer, by a stream of hot air or by washing with a readily volatile solvent, such as ethanol and/or isopropanol, which forms an azeotrope with water.

Accordingly, the present invention also relates to a process for cleaning electronic and electrical assemblies using water-miscible cleaning agents free from halogenated hydrocarbons of the type defined above. More particularly, the invention relates to a process for the removal of fluxes after soldering.

The invention is illustrated by the following Examples.

EXAMPLE 1

A rosin-based flux is applied to a circuit board and dried at 150° to 200° C. The circuits are then soldered by hand using a commercially available solder.

The board thus treated was ultrasonicated for 2 minutes at 55° C. in an aqueous solution containing 60% by weight of diacetone alcohol, 12% by weight N-methyl-2-pyrrolidone, 2% by weight of a nonionic surfactant ($C_{13}$ alkyl polyethylene glycol ether containing 5 ethylene oxide units) and 1% by weight of an anionic surfactant ($C_{13-17}$ alkylsulfonic acid, Na salt). The circuit board was then rinsed with water and dried in a drying cabinet.

After this treatment, the surface was microscopically clean and no coatings (white deposits) were in evidence, even on the circuits.

EXAMPLE 2

Another circuit board was pretreated as described in Example 1 and then cleaned by spraying for 3 minutes by spraying at 55° C. (spraying pressure 4 bar) with an aqueous solution of 60% by weight of diacetone alcohol, 12% by weight of N-methyl- 2-pyrrolidone, 2% by weight of triethanolamine, 2% by weight of a nonionic surfactant ($C_{13}$ alkyl polyethylene glycol ether containing 5 ethylene oxide units) and 1% by weight of an anionic surfactant ($C_{13-17}$ alkylsulfonic acid, Na salt).

After rinsing with water and drying, the surfaces showed no residues of rosin under a microscope and even the circuits were bright and free from any deposits.

EXAMPLE 3

After reflow soldering, a circuit board provided with solder paste and equipped with SMD units was ultrasonicated for 3 minutes at 45° C. in a solvent mixture containing 86% by weight of diacetone alcohol, 9% by weight of N-methyl-2-pyrrolidone, 2% by weight of triethanolamine, 2% by weight of $C_{13}$ alkyl polyethylene glycol ether containing 5 ethylene oxide units and 1% by weight of $C_{13-17}$ alkylsulfonic acid Na salt.

The circuit board was then rinsed with water and dried in a drying cabinet. After this treatment, the surface of the circuit board was completely clean and did not show any residues of the solder paste, even in the vicinity of the contact feet and in the narrow gaps beneath the SMD units.

The invention claimed is:

1. A process for cleaning resin flux from electronic and electrical assemblies comprising contacting said electronic and electrical assemblies with a water-miscible cleaning agent free from halogenated hydrocarbons and containing diacetone alcohol in quantities of 30 to 90% by weight, based on the weight of the cleaning agent.

2. A process as claimed in claim 1, wherein the cleaning agent contains diacetone alcohol in quantities of 30 to 80% by weight, based on the cleaning agent, in an aqueous solution.

3. A process as claimed in claim 2, wherein the cleaning agent contains diacetone alcohol in quantities of 50 to 70% by weight in an aqueous solution.

4. A process as claimed in claim 3, wherein the cleaning agent contains anionic surfactants, nonionic surfactants, or both in a quantity of up to 10% by weight, based on the cleaning agent.

5. A process as claimed in claim 4, wherein the cleaning agent contains anionic surfactants, nonionic surfactants, or both in quantities of 1 to 5% by weight.

6. A process as claimed in claim 5, wherein the cleaning agent contains water-soluble organic nitrogen bases in quantities of 1 to 10% by weight, based on the cleaning agent.

7. A process as claimed in claim 6, wherein the cleaning agent contains triethanolamine in quantities of 2 to 5% by weight.

8. A process as claimed in claim 7, wherein the cleaning agent contains water-soluble solvents selected from alcohols, glycols, glycol ethers, glycol esters, glycolic acid esters, lactones and lactams in a quantity of up to 30% by weight, based on the cleaning agent.

9. A process as claimed in claim 8, wherein the cleaning agent contains N-methyl-2-pyrrolidone in quantities of 5 to 20% by weight.

10. A process as claimed in claim 9, wherein the cleaning agent contains inorganic builders selected from the group consisting of alkali metal phosphates in a quantity of at most 5% by weight, based on the cleaning agent.

11. A process as claimed in claim 10, wherein the cleaning agent contains inorganic builders in quantities of 1 to 2% by weight.

12. A process as claimed in claim 11, wherein the cleaning agent contains corrosion inhibitors in quantities of 0.01 to 5% by weight, based on the cleaning agent.

13. A process as claimed in claim 12, wherein the cleaning agent contains corrosion inhibitors in quantities of 0.01 to 1% by weight.

14. A process as claimed in claim 1, wherein the cleaning agent is used to remove fluxes after soldering.

15. A process as claimed in claim 14, wherein the cleaning process is assisted by ultrasonication, stirring, vibration, blowing through of air, liquid circulation of the cleaning agent or by spraying, immersion, brushing, flooding or combinations thereof.

16. A process as claimed in claim 1, wherein the cleaning agent contains anionic surfactants, nonionic surfactants, or both in a quantity of up to 10% by weight, based on the cleaning agent.

17. A process as claimed in claim 1, wherein the cleaning agent contains water-soluble organic nitrogen bases in quantities of 1 to 10% by weight, based on the cleaning agent.

18. A process as claimed in claim 1, wherein the cleaning agent contains inorganic builders selected from the group consisting of alkali metal phosphates in a quantity of at most 5% by weight, based on the cleaning agent.

19. A process as claimed in claim 1, wherein the cleaning agent contains corrosion inhibitors in quantities of 0.01 to 5% by weight, based on the cleaning agent.

* * * * *